United States Patent
Joo et al.

(10) Patent No.: US 6,586,287 B2
(45) Date of Patent: Jul. 1, 2003

(54) METHOD FOR FABRICATING THIN FILM TRANSISTOR INCLUDING CRYSTALLINE SILICON ACTIVE LAYER

(75) Inventors: Seung Ki Joo, 203-101, Bungdang Chungang Heights Second complex, 369-19, Gungnae-dong, Bungdang-gu, Seongnam-si, Kyunggi-do (KR); Seok-Woon Lee, Incheon (KR)

(73) Assignee: Seung Ki Joo (KR)

( * ) Notice: Subject to any disclaimer, the term of this patent is extended or adjusted under 35 U.S.C. 154(b) by 0 days.

(21) Appl. No.: 10/113,351

(22) Filed: Apr. 1, 2002

(65) Prior Publication Data

US 2002/0142528 A1 Oct. 3, 2002

(30) Foreign Application Priority Data

Mar. 30, 2001 (KR) .......................... 2001-16923

(51) Int. Cl.⁷ .......................... H01L 21/00; H01L 21/84
(52) U.S. Cl. .......................... 438/166; 438/162
(58) Field of Search .......................... 438/166, 162, 438/151, 163

(56) References Cited

U.S. PATENT DOCUMENTS 6,194,255 B1 * 2/2003 Hiroki et al. ................ 438/166
2002/0153527 A1 * 10/2002 Chang et al. ................ 257/70
2002/0192884 A1 * 12/2002 Chang et al. ................ 438/164

OTHER PUBLICATIONS

Kim et al. "The Effects of Electrical Stress and Temperature on the Properties of poly–Si TFTs Fabricated by MILC", IEEE Electron Device Letters, 21(7), p. 347.*

Meng et al. "Suppression of Leakage Curretn in low–T MILC poly–Si TFTs Using an Improved Process Sequence and Gate Modulated LDD Structure", IEEE IEDM 01–755.*

Lee et al. "Low–T poly–Si TFT Fabrication by MILC", IEE Electron Device Letters, 17(4), p. 160.*

* cited by examiner

Primary Examiner—John F. Niebling
Assistant Examiner—Viktor Simkovic
(74) Attorney, Agent, or Firm—Baker Botts LLP

(57) ABSTRACT

The invention provides a method for fabricating a TFT including a crystalline silicon active layer. The inventive method forms a metal offset region between the metal layer used to induce the cystallization of the active layer and the channel region of the TFT without introducing an additional process such as photoresist processing. Therefore, the inventive method improves the performance and manufacturing productivity of TFT and lower its production cost as well.

18 Claims, 14 Drawing Sheets

Thermal Treatment

Thermal Treatment

METHOD FOR FABRICATING THIN FILM TRANSISTOR INCLUDING CRYSTALLINE SILICON ACTIVE LAYER

TECHNICAL FIELD

The present invention relates to a TFT used for liquid crystal display (LCD) and organic light emitting diode (OLED), etc. More particularly, the present invention relates to a TFT including a crystalline silicon active layer providing the source, drain, and channel regions of the TFT, and to a method for fabricating a TFT including the crystalline silicon active layer.

BACKGROUND OF THE INVENTION

Thin film transistor (TFT) used for display devices such as liquid crystal display (LCD) and organic light emitting diode (OLED) is formed by depositing a silicon layer on a transparent substrate such as a glass or quartz, forming a gate and a gate electrode on the silicon layer, implanting dopant in the source and the drain regions of the silicon layer, performing an annealing to activate the dopant, and finally forming an insulation layer thereon. An active layer constituting the source, drain, and channel regions of a TFT is formed by depositing a silicon layer on a transparent substrate such as glass by means of chemical vapor deposition (CVD) and the like. The silicon layer directly deposited on the substrate by CVD is an amorphous silicon layer, which has low electron mobility. As display devices using thin film transistors requires high operation speed and miniaturized structure, the integration degree of its driving ICs becomes higher and the aperture ratio of the pixel region becomes lower. Therefore, it is required increase the electron mobility of the silicon layer in order to form the driving circuit along with the pixel TFT and to enhance the pixel aperture ratio. For this purpose, technologies for forming a polycrystalline silicon layer having high electron mobility by crystallizing an amorphous silicon layer with thermal treatment have been in use as described below.

Solid phase crystallization (SPC) method is used to anneal an amorphous silicon layer at a temperature of 600° C. or below for a few hours or tens of hours. 600° C. is the temperature causing deformation of the glass constituting the substrate. However, the SPC method has the following disadvantages. Since the SPC method requires a thermal treatment for a long time, the SPC method has low productivity. In addition, when annealing a large-sized substrate, the SPC method causes deformation of the substrate during the extended thermal treatment even at a temperature of 600° C. or below.

Excimer laser crystallization (ELC) method locally generates a high temperature on the silicon layer for a very short time by scanning an excimer laser beam to instantaneously crystallize the silicon layer. However, the ELC method has the following disadvantages. The ELC method has difficulties in accurately controlling the scanning of the laser beam. In addition, since the ELC method processes only one substrate at a time, the ELC method has relatively low productivity as compared to a method wherein a plurality of substrates are processed in a furnace at one time.

To overcome the aforementioned disadvantages of the conventional silicon crystallization methods, a method of inducing crystallization of an amorphous silicon layer at a low temperature about 200° C. by contacting or implanting metals such as nickel, gold, and aluminum has been proposed. This phenomenon that low-temperature crystallization of amorphous silicon is induced with metal is conventionally called as metal induced crystallization (MIC). However, this metal induced crystallization (MIC) method also has following disadvantages. If a TFT is manufactured by the MIC method, the metal component used to induce the crystallization of silicon remains in the crystallized silicon providing the active layer of the TFT. The metal component remaining in the active layer causes current leakage in the channel region of the TFT.

Recently, a method of crystallizing a silicon layer by inducing crystallization of amorphous silicon in the lateral direction using a metal, which is conventionally refereed to as "metal induced lateral crystallization" (MILC), was proposed. (See S. W. Lee and S. K. Joo, *IEEE Electron Device Letter*, 17(4), p. 160, 1996) In the metal induced lateral crystallization (MILC) phenomenon, metal does not directly cause the crystallization of the silicon, but the silicide generated by a chemical reaction between metal and silicon induces the crystallization of the silicon. As the cystallization proceeds, the silicide propagates in the lateral direction of the silicon inducing the sequential crystallization of the adjacent silicon region. As the metal causing this MILC, nickel and palladium or the like are known to those skilled in the art. Crystallizing a silicon layer by the MILC, a silicide containing crystallization inducing metal moves along the lateral direction as the crystallization of the silicon layer proceeds. Accordingly, little metal component is left in the silicon layer crystallized by the MILC. Therefore, the crystallized silicon layer does not adversely affect the current leakage or other characteristics of the TFT including the silicon layer. In addition, using the MILC, crystallization of silicon may be induced at a relatively low temperature of 300° C.~500° C. Thus, a plurality of substrates can be crystallized in a furnace at one time without causing any damages to the substrates.

FIG. 1A to FIG. 1D are cross-sectional views illustrating a conventional method for crystallizing a silicon active layer of TFT using the MIC and the MILC methods. Referring to FIG. 1A, an amorphous silicon layer 11 is formed on an insulation substrate 10 having a buffer layer (not shown) thereon. The amorphous silicon layer 11 is patterned by photolithography so as to form an active layer. A gate insulation layer 12 and a gate electrode 13 are formed on the active layer 11 by using conventional methods. As shown in FIG. 1B, the substrate is doped with impurity using the gate electrode 13 as a mask. Thus, a source region 11S, a channel region 11C and a drain region 11D are formed in the active layer. As shown in FIG. 1C, photoresist 14 is formed to cover the gate electrode 13, the source region 11S and the drain region 11D in the vicinity of the gate electrode 13, and a metal layer 15 is deposited over the substrate 10 and the photoresist 14. As shown in FIG. 1D, after removing the photoresist 14, the entire substrate is annealed at a temperature of 300–500° C. As a result the source and drain regions 16 covered with the residual metal layer 15 are crystallized by the MIC caused by the metal layer 15, and the region indicated by reference numeral 17 and consisting of the metal-offset part of the source and the drain regions and the channel region under the gate electrode 13 are respectively crystallized by the MILC propagating from the source and drain regions 16 covered with the metal layer 15

The photoresist 14 is formed to cover a part of the source and the drain regions adjacent to the gate electrode 13 in order to prevent the current leakage in the channel region and the degradation of the operation characteristics of the same. If the metal layer 15 is formed to cover the entire source and drain regions, the current leakage and the degradation of the operation characteristics occur because the metal component used to cause the MIC remains in the channel region 11C and the boundaries between the channel region and the source and the drain regions. Since the operation of the source and drain regions is not substantially affected by the residual metal component, the source and drain regions apart from the channel region by a distance over 0.01~5 μm may be crystallized by the MIC directly caused by the MIC metal 15. Meanwhile, the channel region and the source and the drain regions adjacent to the channel region are crystallized by MILC induced by and propagating from the MIC metal. Crystallizing only the channel region and its vicinity by MILC, the time required to crystallize the entire active layer may be significantly reduced. However, when using the process shown in FIGS. 1A to 1D, a step of forming a photoresist layer, a step of patterning and removing the photoresist should be included in the conventional TFT fabrication process.

SUMMARY OF THE INVENTION

Accordingly, one object of the present invention is to provide a method for manufacturing a large quantity of TFT's at a low cost by conducting annealing of a plurality of substrates utilizing MILC at a relatively low temperature compared to the SPC method and the ELC method.

It is another object of the present invention to provide a TFT fabrication method according to which the metal component used to induce the MIC does not remain in the channel region of the TFT and does not comprise the processes of forming and removing the photoresist layer in contrast to the conventional TFT fabrication method using MILC.

According to one feature of the invention, a method for fabricating a thin film transistor (TFT) including a silicon active layer comprising the steps of providing a substrate; depositing an amorphous silicon layer on the substrate to provide an active layer of the TFT; forming a gate insulation layer and a gate electrode on the amorphous silicon layer; doping the amorphous silicon layer with impurity to form a source region, a drain region and a channel region of the active layer and depositing a crystallization inducing metal on at least a portion of the amorphous silicon layer; and crystallizing the amorphous silicon layer crystallization by conducting thermal treatment thereof, and being characterized in that the crystallization inducing metal is offset from the channel region of the active layer using a mask which does not include a photoresist layer is provided.

According to another feature of the invention, the crystallization inducing metal is offset from the channel region of the active layer using a photoresist mask which is formed by processing a photoresist layer used to pattern the gate electrode and remaining on the top of the patterned gate electrode.

Additional features and advantages of the present invention will be set forth or will be apparent from below detailed description of the invention. The objectives and other advantages of the invention will be realized and attained by the scheme particularly pointed out in the written description and claims hereof as well as the appended drawings.

BRIEF DESCRIPTION OF THE DRAWINGS

The embodiments of the present invention will be explained with reference to the accompanying drawings, in which.

DETAILED DESCRIPTION OF THE INVENTION

Reference will now be made in detail to the preferred embodiments of the present invention, examples of which are illustrated in the accompanying drawings.

Figure 1A:
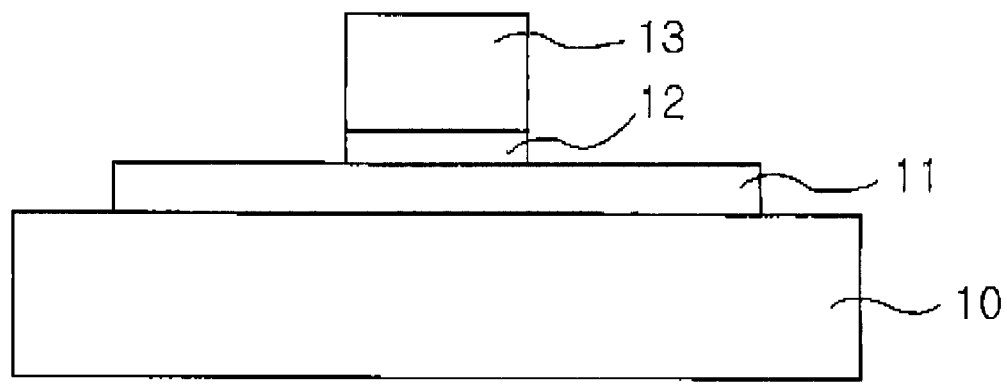
FIG. 1A to FIG. 1D are cross-sectional views illustrating the sequence of the conventional method for fabricating a crystalline silicon TFT by using MILC.
Figure 1B:
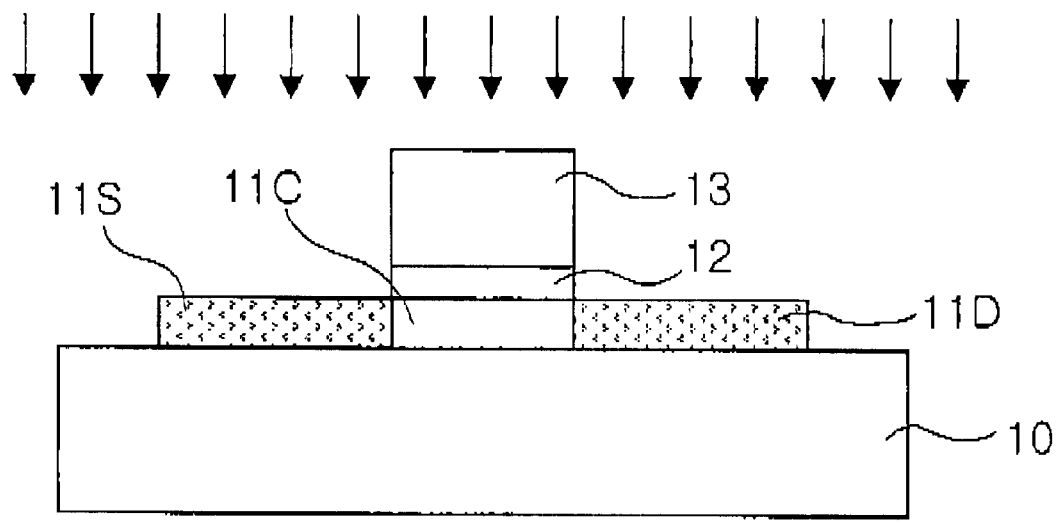
Figure 1C:
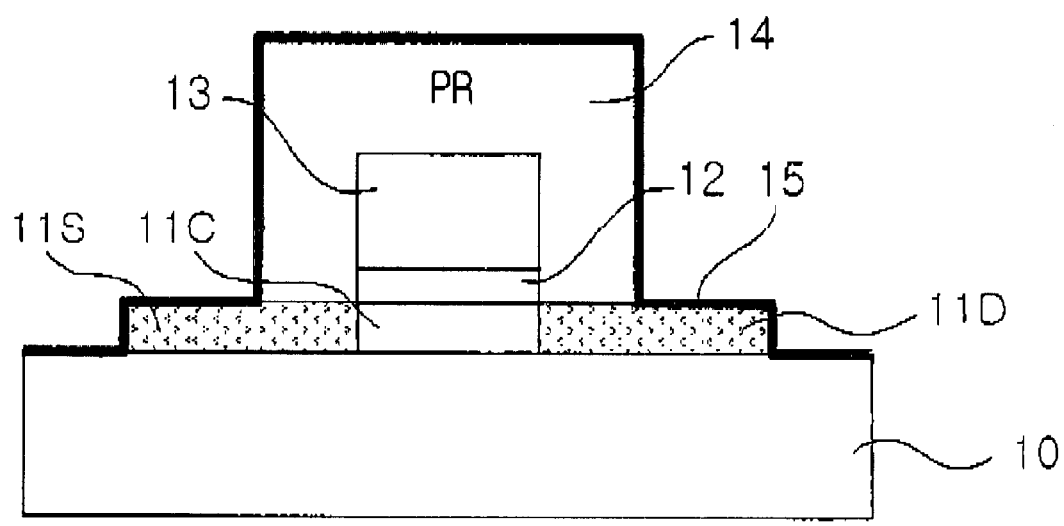
Figure 1D:
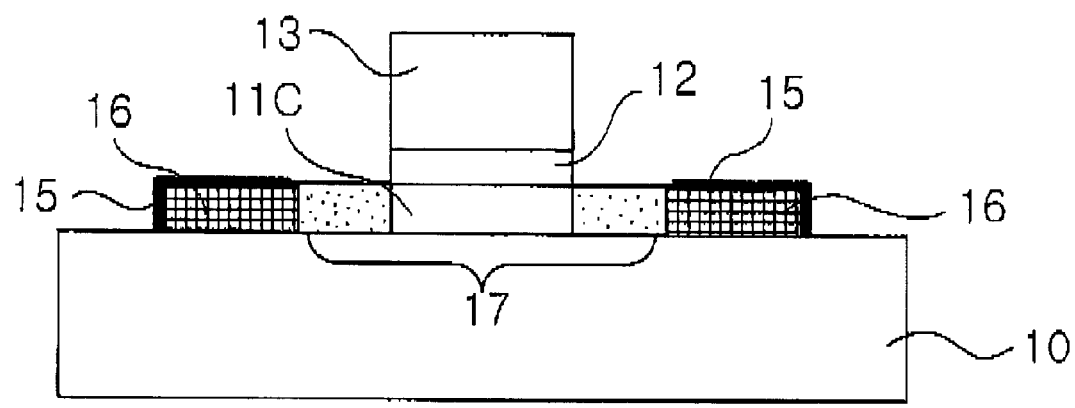
Figure 2A:
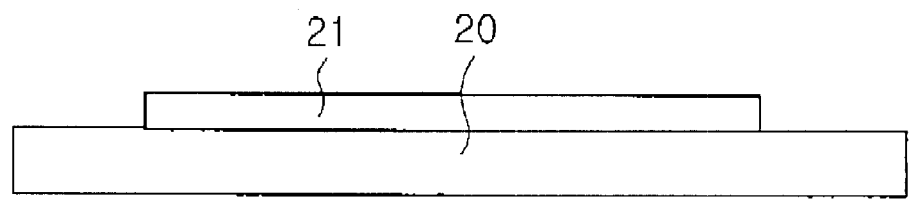
FIG. 2A to FIG. 2F are cross-sectional views illustrating the method for fabricating a crystalline silicon TFT according to a preferred embodiment of the present invention.

FIGS. 2A to 2F are cross-sectional views illustrating the method for fabricating a crystalline silicon TFT by using MILC according to a first preferred embodiment of the present invention. Referring to FIG. 2A, an amorphous silicon layer 21 to provide an active layer of a TFT is formed and patterned on an insulation substrate 20. The substrate 20 is made of insulating material such as Corning 1737 glass, quartz, silicon oxide or oxidized silicon wafer. According to needs, an optional buffer layer (not shown) may be formed on the substrate in order to prevent the diffusion of contaminants from the substrate 20. The active layer 21 is formed by depositing amorphous silicon with a thickness in the range of 100 Å to 3,000 Å, preferably with a thickness in the range of 500 Å to 1,000 Å using PECVD, LPCVD or sputtering method. The active layer 21 includes source, drain and channel regions and may also include areas reserved for other devices and electrodes. The active layer 21 is patterned to match the size of the TFT to be fabricated.

Figure 2B:
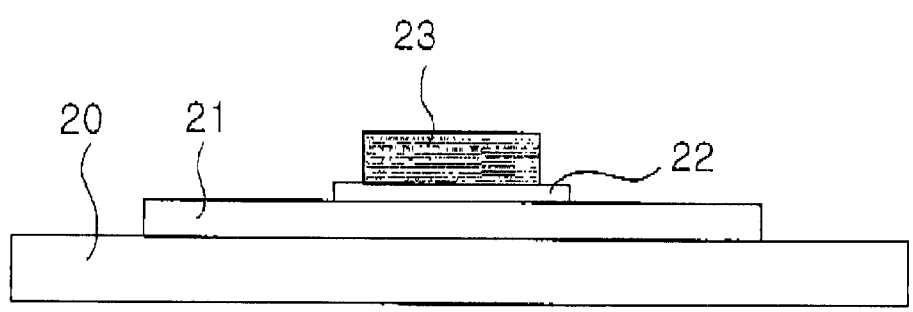

FIG. 2B illustrates a cross-section of the structure in which a gate insulation layer 22 and a gate electrode 23 are formed on the substrate 20 and the active layer 21. As shown in FIG. 2B, the gate insulation layer 22 is formed by depositing $SiO_2$, SiNx, SiOxNy or a combination thereof with a thickness in the range of 300 Å to 3,000 Å, preferably with a thickness in the range of 500 Å to 1,000 Å using various deposition methods such as PECVD, LPCVD, APCVD and ECR CVD. The gate electrode layer consisting of conductive material such as metal and doped polysilicon is formed on the gate insulation layer 22 by sputtering, heating evaporation, PECVD, LPCVD, APCVD, or ECR CVD, and it is patterned to form the gate electrode 23. The gate electrode layer is formed with a thickness in the range of 1,000 Å to 8,000 Å, preferably with a thickness in the range of 2,000 Å to 4,000 Å. The gate insulation layer 22 and the gate electrode 23 are patterned and etched using a mask. By over-etching the gate electrode 23 during the etching process the outer edges of the gate insulation layer 22 are not covered by the gate electrode 23.

Figure 2C:
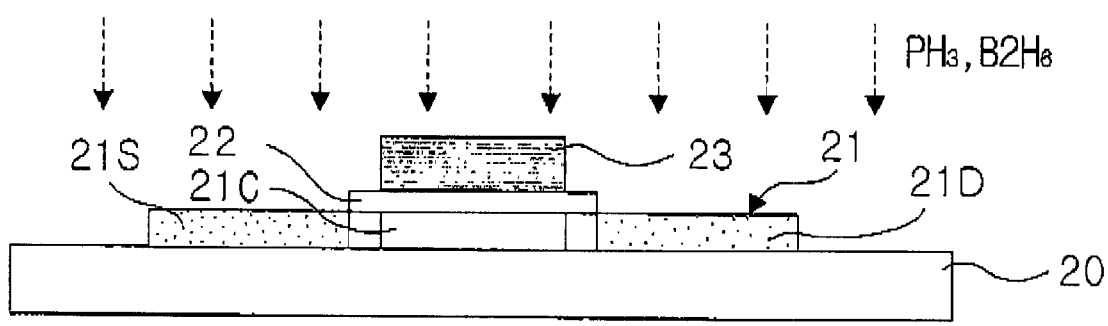

FIG. 2C is a cross-sectional view illustrating the process of doping the source region 21S and the drain region 21D of the active layer 21 using the gate electrode 23 as a mask. For fabricating a NMOS (N-channel metal oxide semiconductor) TFT, the active layer is doped with dopant such as $PH_3$, P and As with a dose of 1E11~1E22/cm$^3$ (preferably 1E15~1E21/cm$^3$) at the energy level of 10~200 KeV (preferably 30~100 KeV) using ion shower doping method or ion implantation method, etc. For fabricating a PMOS (P-channel metal oxide semiconductor) TFT, the active layer is doped with dopant such as $B_2H_6$, B and $BH_3$ with a dose of 1E11~1E22/cm$^3$ (preferably 1E14~1E21/cm$^3$) at the energy level of 10~200 KeV. When a lightly doped region is not formed in the active layer, the doping energy is controlled so that the active layer region cover with the exposed portion of the gate insulation layer 22 is doped with high concentration of the dopant. When necessary, the dopant injection can be performed in two stages.

Figure 2D:
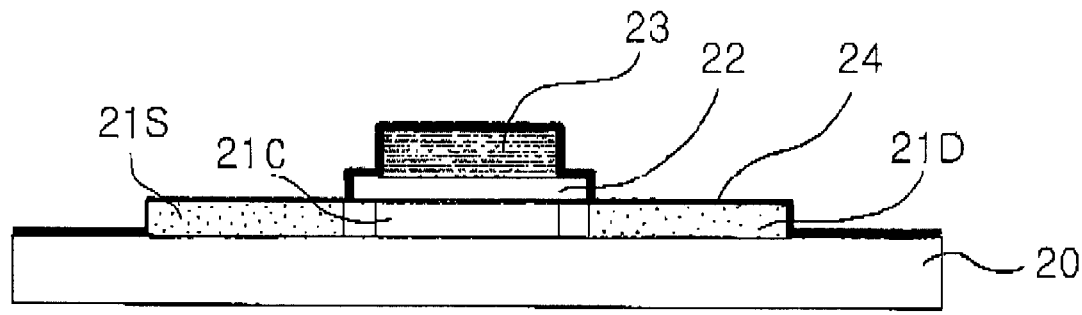

FIG. 2D is a cross-sectional view illustrating that a metal layer 24 is formed on the structure as illustrated in FIG. 2C. Preferably, the metal layer is formed of Ni. It should be noted that the metal layer 24 is offset from the channel region 21C covered with the gate insulation layer 22 and the gate electrode 23. Therefore, this process does not require additional photoresist process in order to offset the metal layer 24 from the channel region 21C. For the metal layer, various metals such as Pd, Ti, Ag, Au, Al, Sn, Sb, Cu, Co, Cr, Mo, Tr, Ru, Rh, Cd, Pt or their combination may also be used. The crystallization inducing metal may be deposited by sputtering, heating evaporation, PECVD or ion implantation. However, sputtering method is most preferably used. The thickness of the metal layer 24 can be freely selected within a range that is adequate to induce the cystallization of the active layer. Generally, the metal layer 24 is formed with a thickness in the range of 1 Å to 10,000 Å, preferably with a thickness in the range of 10 Å to 200 Å.

Figure 2E:
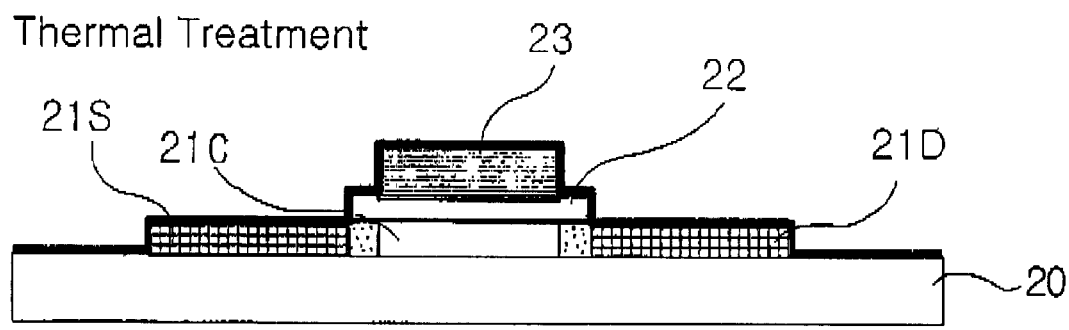

Then, as illustrated in FIG. 2E, thermal treatment is conducted to induce the crystallization of the active layer 21 and to active the dopant injected into the source region 21S and the drain region 21D at the same time. The thermal treatment can be conducted by RTA (rapid thermal annealing), ELC (excimer laser crystallization) method or furnace annealing. The RTA method heats the substrate at a temperature about 700° C.~800° C. for a few seconds or a few minutes using a tungsten-halogen lamp or a xenon arc lamp. The ELC method heats the active layer to a very high temperature for a very shot time using an excimer laser. Particularly, in a preferred embodiment of the invention, the thermal treatment is performed in a furnace at a temperature about 300° C.~700° C. for 0.1~50 hours, desirably for 0.5~20 hours. During the furnace annealing, the active layer is crystallized by MIC and MILC induced by the metal deposited on the active layer. As described above with reference to FIGS. 1A to 1D, the amorphous silicon in contact with the metal layer is crystallized by MIC and the remaining portion of the active layer is crystallized by MILC. After the thermal treatment, the metal layer 24 may be either removed by etching or remained. Since the thermal treatment condition for crystallizing the amorphous silicon layer by the MILC is similar to the annealing condition used to activate the dopant implanted in the active layer, the crystallization of the active layer and the activation of the dopant may be conducted simultaneously.

Figure 2F:
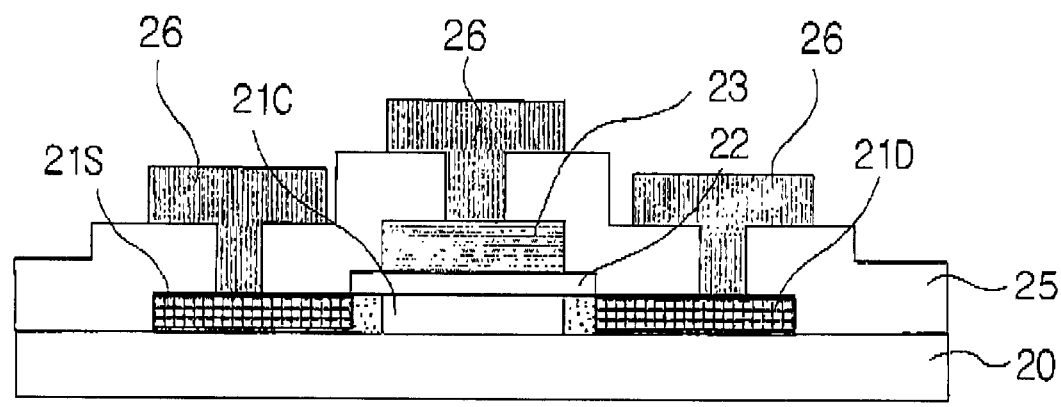

Then, as illustrated in FIG. 2F, a contact insulation layer 25 is formed over the substrate to cover the active layer and the gate electrode, and contact holes are formed to expose portions of the source region and the drain region using conventional methods. Through the contact holes, contact electrodes are formed to provide electrical connection to the TFT elements.

Figure 3A:
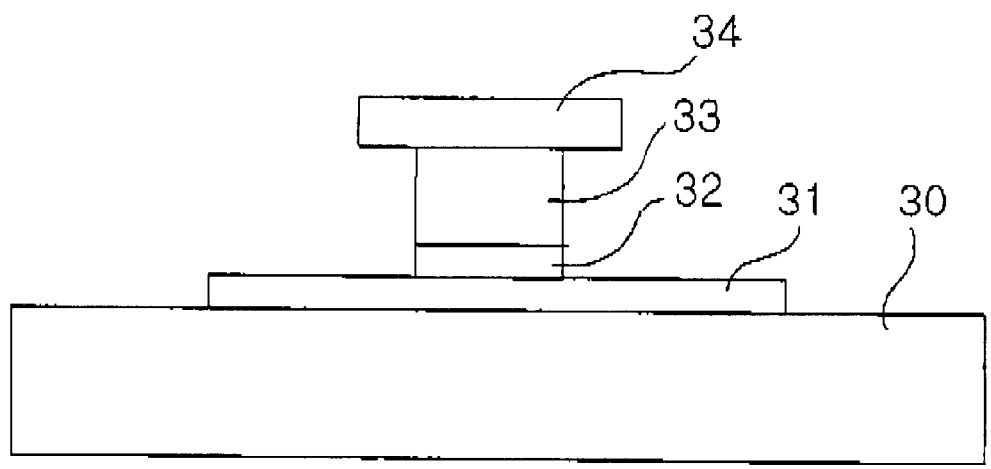
FIG. 3A to FIG. 3E are cross-sectional views illustrating the method for fabricating a crystalline silicon TFT according to another preferred embodiment of the present invention.
Figure 3B:
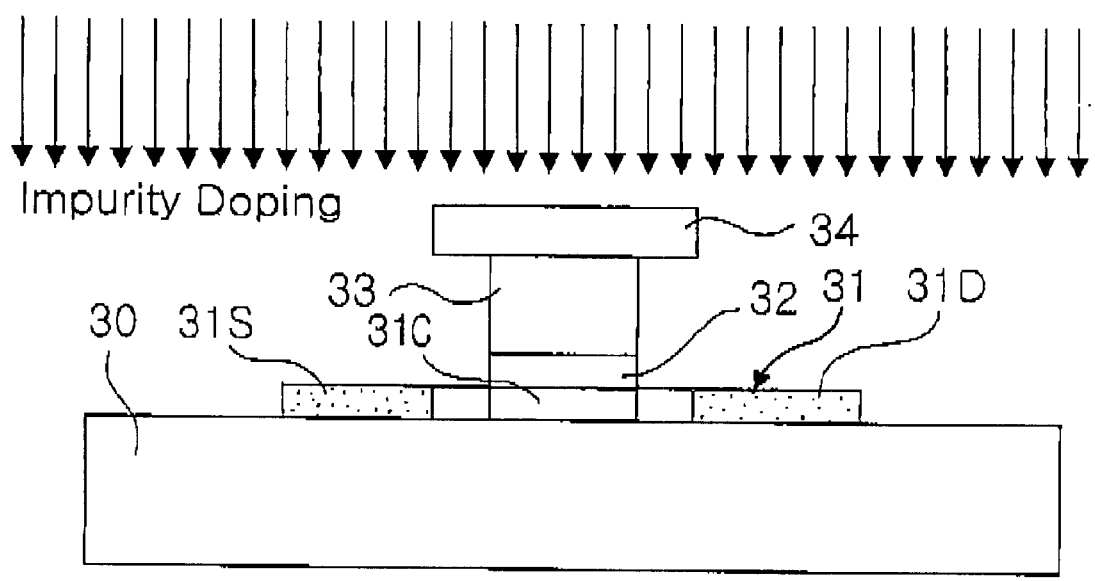

FIG. 3A to FIG. 3E are cross-sectional views illustrating the process of fabricating a crystalline silicon TFT by MILC according to another preferred embodiment of the present invention. Referring to FIG. 3A, an amorphous silicon layer 31 providing the active layer of a TFT is formed and patterned on an insulation substrate 30. A gate insulation layer 32 and a lower gate electrode 33 and a upper gate electrode 34 are formed on the amorphous silicon layer 31. FIG. 3B illustrates a process of conducting a high-concentration doping of the amorphous silicon layer 31 using the upper gate electrode 34 as a mask to form a source region 31S and a drain region 31D. For fabricating a NMOS (N-channel metal oxide semiconductor) TFT, the active layer is doped with dopant such as $PH_3$, P and As with a dose of 1E11~1E22/cm$^3$ (preferably 1E15~1E21/cm$^3$) at the energy level of 10~200 KeV (preferably 30~100 KeV) using ion shower doping method or ion implantation method, etc. For fabricating a PMOS (P-channel metal oxide semiconductor) TFT, the active layer is doped with dopant such as, $B_2H_6$, B and $BH_3$ with a dose of 1E11~1E22/cm$^3$ (preferably 1E14~1E21/cm$^3$) at the energy level of 10~200 KeV. When a lightly doped region is not formed in the active layer, the doping energy is controlled so that the active layer region cover with the exposed portion of the gate insulation layer 22 is doped with high concentration of the dopant. When necessary, the dopant injection can be performed in two stages.

Figure 3C:
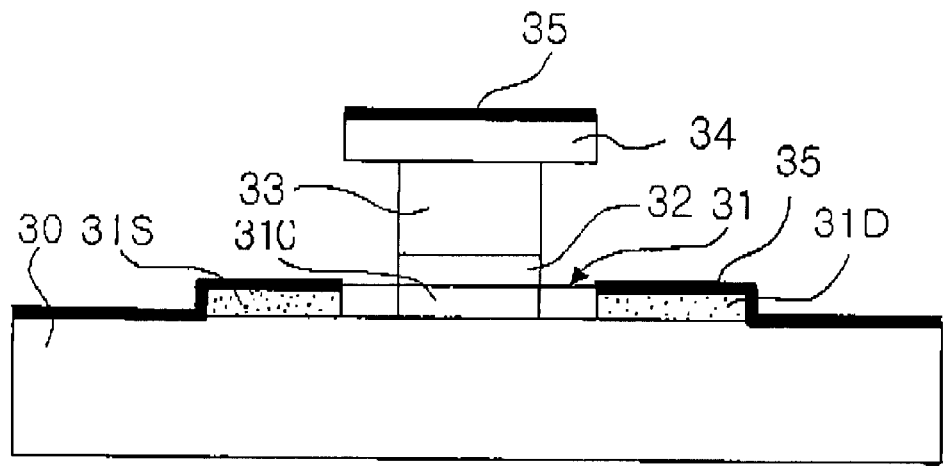

Then, as shown in FIG. 3C, a metal layer 35 such as Ni layer for inducing the crystallization of the amorphous silicon layer 31 using the upper gate electrode 34 as a mask. For the metal inducing the crystallization of the amorphous silicon layer 31, Ni or Pd is preferably used. Also, other metal such as various metals such as Ti, Ag, Au, Al, Sn, Sb, Cu, Co, Cr, Mo, Tr, Ru, Rh, Cd, Pt or their combination may be used. The crystallization inducing metal may be deposited by sputtering, heating evaporation, PECVD or ion implantation. However, sputtering method is most preferably used. The thickness of the metal layer 35 can be freely selected within a range that is adequate to induce the crystallization of the active layer. Generally, the metal layer 35 is formed with a thickness in the range of 1 Å to 10,000 Å, preferably with a thickness in the range of 10 Å to 200 Å.

Since the width of the upper gate electrode 34 is wider than that of the lower gate electrode 33, the crystallization inducing metal layer 35 is not formed on the portions of the active layer masked by the upper gate electrode 34. Thus, the crystallization inducing metal 35 becomes offset from the channel region 31C. As described above, if the crystallization inducing metal directly contacts with the channel region 31C without the metal offset region, the residual metal component remaining in the channel region 31C after the crystallization by MIC and MILC tend to deteriorate the performance of the TFT. In the present invention, the width of the metal offset region is set within the range of 1,000 Å to 20,000 Å, more preferably within the range of 5,000 Å to 10,000 Å. Within the scope of the present invention, the order of the high-concentration doping process and the metal layer forming process may be reversed.

Figure 3D:
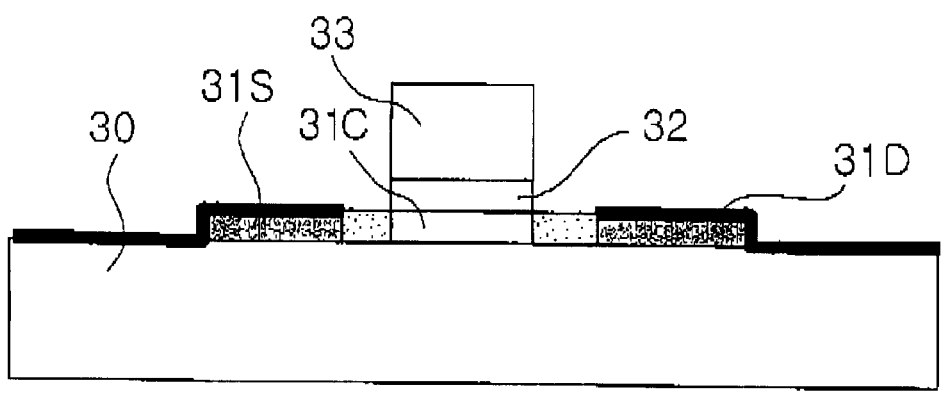
Figure 3E:
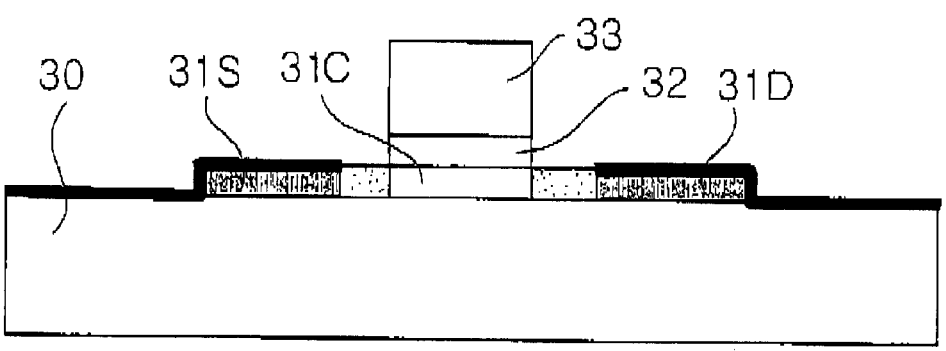

After forming the crystallization inducing metal layer 35, the upper gate electrode 34 is removed as depicted in FIG. 3D. Then, as illustrated in FIG. 3E, the active layer is crystallized by a thermal treatment, and an insulation layer and contact electrode (not shown) are formed thereon to complete the TFT fabrication. The thermal treatment of FIG. 3E may use any methods that may induce the crystallization of amorphous silicon. For example, RTA (rapid thermal annealing) or ELC (excimer laser crystallization) method may be used for the thermal treatment of the amorphous silicon active layer. The RTA method performs heating at a temperature about 700° C.~800° C. for a few seconds or a few minutes using a tungsten-halogen lamp or a xenon arc lamp. The ELC method heats the active layer to a very high temperature for a very shot time using an excimer laser. Particularly, in the present invention, the heating process is preferably performed in a furnace at a temperature of 300° C.~700° C. for 0.1~50 hours, desirably for 0.1~50 hours. Since the furnace annealing method crystallizes the amorphous silicon at a temperature lower than the deformation temperature of the glass substrate, deformation or damage of the glass substrate may be prevented. In addition, because the furnace annealing method may process a plurality of substrates at one time, it substantially enhances the productivity of the process. During the thermal treatment, the portions of the silicon layer covered with the MIC metal are crystallized by the MIC cause by the MIC source metal and the portion of the silicone layer not covered with the MIC metal is crystallized by the MILC propagated from the MIC region to which the MIC metal is applied. In addition, since the thermal treatment condition for crystallizing the amorphous silicon layer by the MIC is similar to the annealing condition used to activate the dopant implanted in the active layer, the crystallization of the active layer and the activation of the dopant may be conducted simultaneously.

When a TFT is fabricated by the aforementioned method, a metal offset region can be formed without including the process of forming a photoresist pattern in order to offset the MIC metal from the channel region. The TFT fabricated according to the method of the present invention has advantages of low leakage current and stable electrical characteristics. Although the above preferred embodiments of the present invention was described for the purpose of illustration, the present invention can be also embodied as other embodiments that will be described below. The process conditions for other embodiments are the same as those of the above embodiments unless mentioned otherwise in this specification.

Figure 4A:
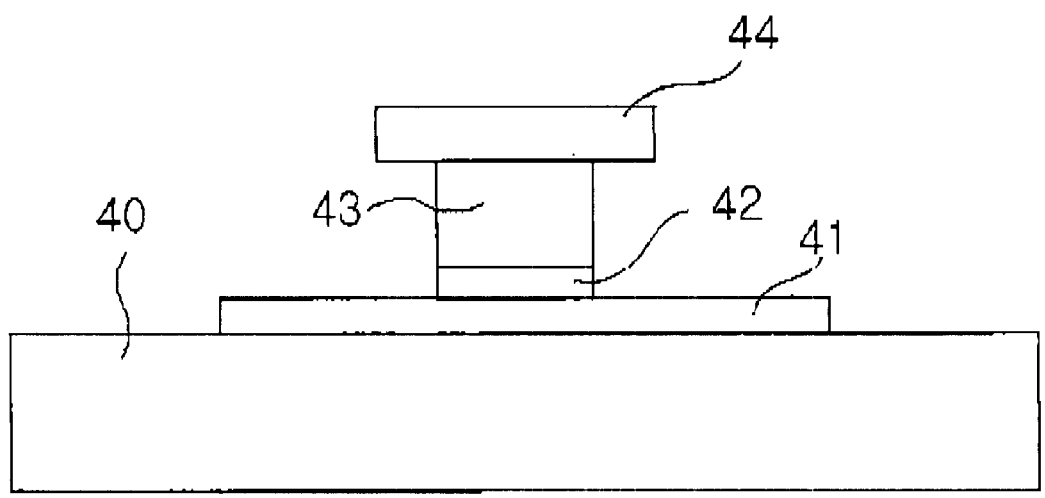
FIG. 4A to FIG. 4E are cross-sectional views illustrating the method for fabricating a crystalline silicon TFT according to still another preferred embodiment of the present invention.
Figure 4B:
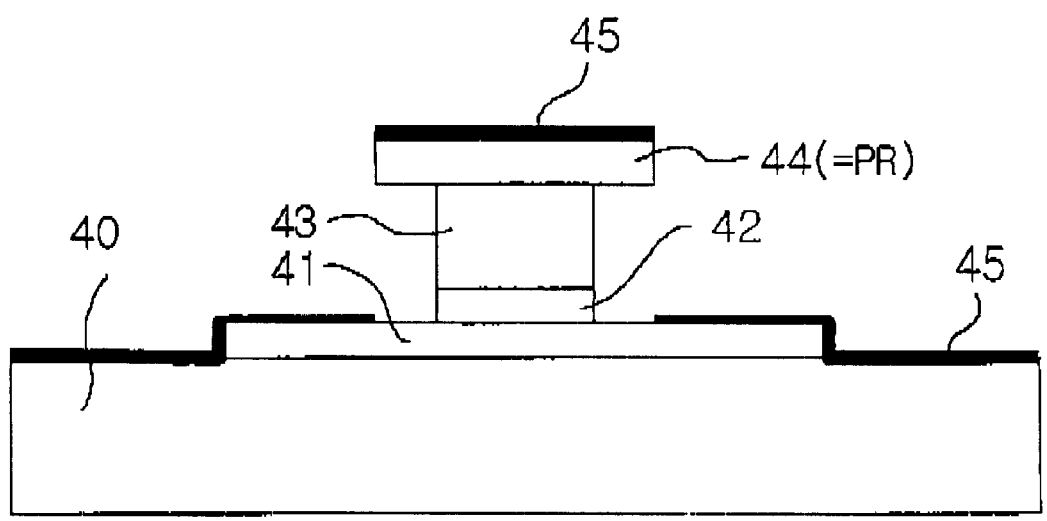
Figure 4C:
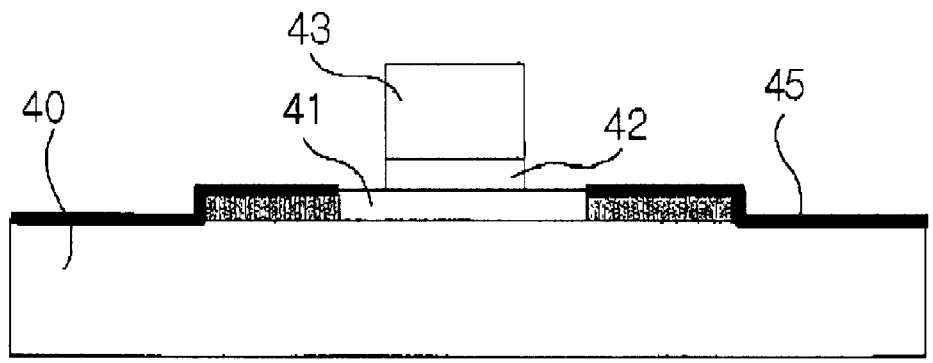

FIG. 4A to FIG. 4B are cross-sectional views illustrating the process for fabricating a crystalline silicon TFT according to another preferred embodiment of the present invention. Referring to FIG. 4A, an amorphous silicon layer 41 providing the active layer of a TFT is formed and patterned on an insulation substrate 40. A gate insulation layer 42 and a gate electrode 43 are formed on the amorphous silicon layer 41. As shown in FIG. 4A, the photoresist 44 used to form the gate electrode 43 is remained on the gate electrode, the gate electrode 43 is over-etched to form an undercut below the photoresist 44. Then, as illustrated in FIG. 4B, a crystallization inducing metal layer 45 is formed using the photoresist 44 as a mask. Since the metal layer 45 is not deposited on the portions of the amorphous silicon layer masked by the photoresist, a metal offset region can be formed around the channel region under the gate electrode 43. Then the photoresist 44 is removed as illustrated in FIG. 4C.

Figure 4D:
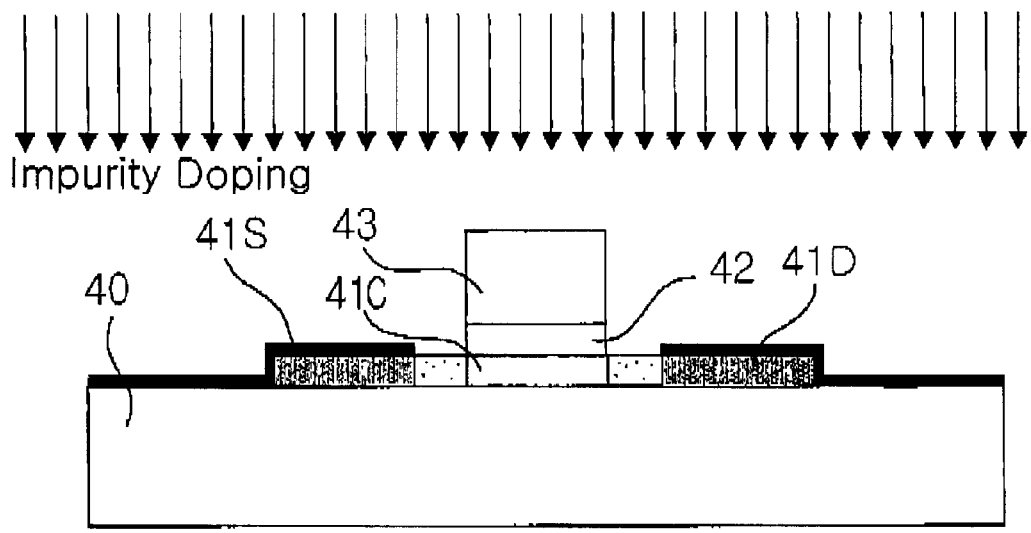
Figure 4E:
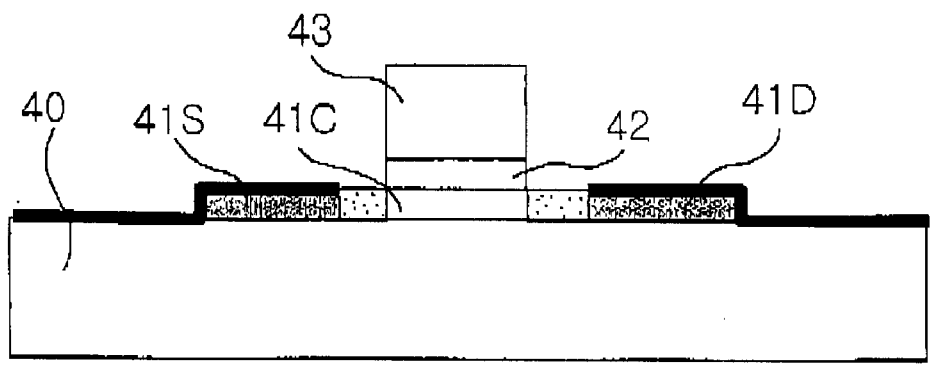

Then a high-density doping is performed to form a source region 41S, a drain region 41D and a channel region as shown in FIG. 4D. The doping energy is controlled so that the dopant is injected with a high concentration and the formation of a lightly doped region is prevented. Thereafter, the active layer is crystallized by thermal treatment and a TFT is completed according to conventional methods. Again, the order of the doping process and the metal layer forming process may be reversed.

Figure 5A:
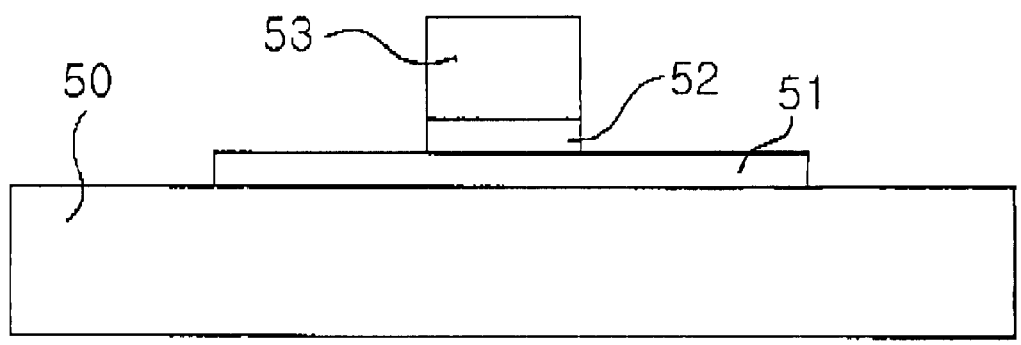
FIG. 5A to FIG. 5D are cross-sectional views illustrating the method for fabricating a crystalline silicon TFT according to still another preferred embodiment of the present invention.
Figure 5B:
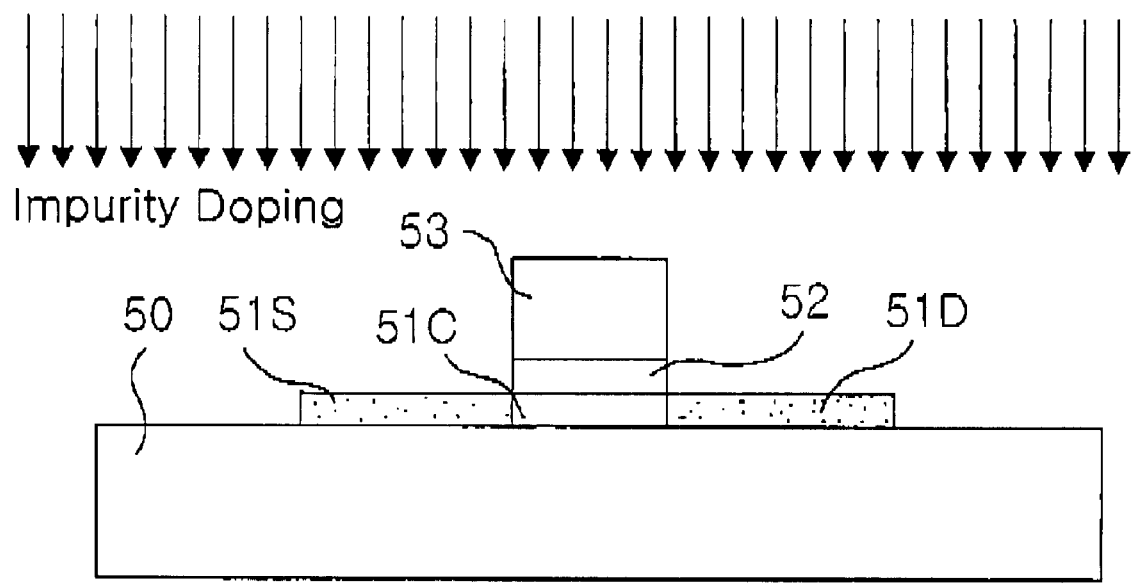
Figure 5C:
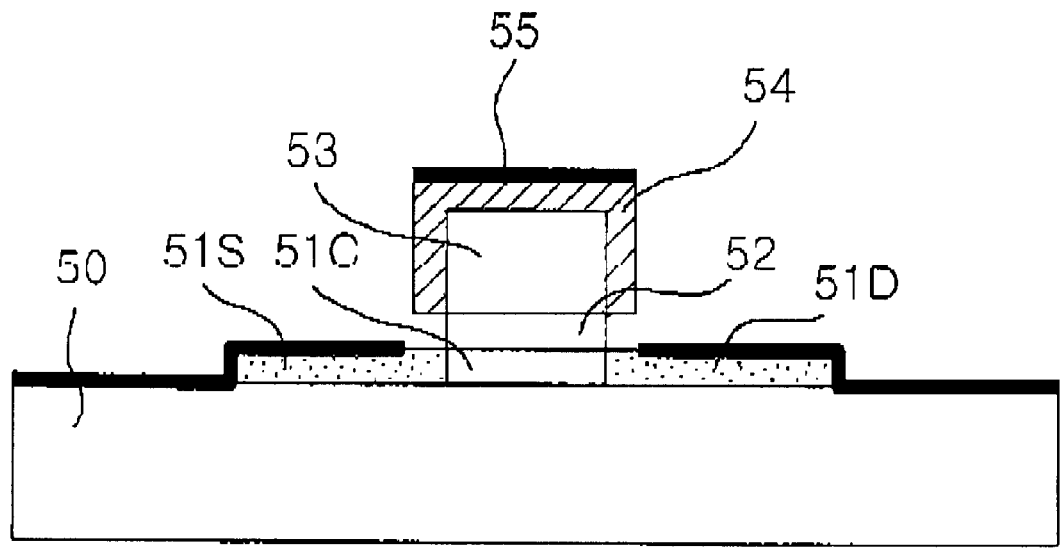
Figure 5D:
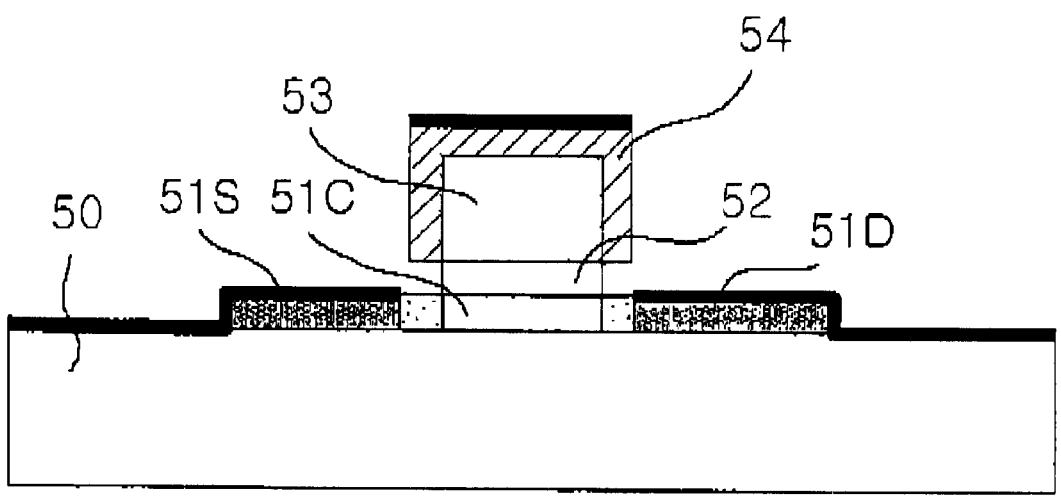

FIG. 5A to FIG. 5E are cross-sectional views illustrating the method for fabricating a crystalline silicon TFT according to another preferred embodiment of the present invention. Referring to FIG. 5A, an amorphous silicon layer 51 providing the active layer of a TFT is formed and patterned on an insulation substrate 50. A gate insulation layer 52 and a gate electrode 53 are formed on the amorphous silicon layer 51. After formation of the gate electrode 53 doping of the amorphous silicon layer 51 is conducted using the gate electrode 53 as a mask to form a source region 51S, a drain region 51D and a channel region 51C as shown in FIG. 5B. The gate electrode 53 is anodized to form an anodic oxide layer 54 on the surface of the gate electrode 53 as shown in FIG. 5C. Then, as shown in FIG. 5C, crystallization inducing metal layer 55 is formed on the entire surface of the substrate. At this time a metal offset region is formed around the gate electrode 53 due to the anodic oxide layer 54. Then a thermal treatment is conducted to crystallize the active layer as shown in FIG. 5D. Thereafter, a TFT is completed using conventional methods. As mentioned above, the order of the doping process and the metal layer forming process may be reversed within the scope of the present invention.

Figure 6A:
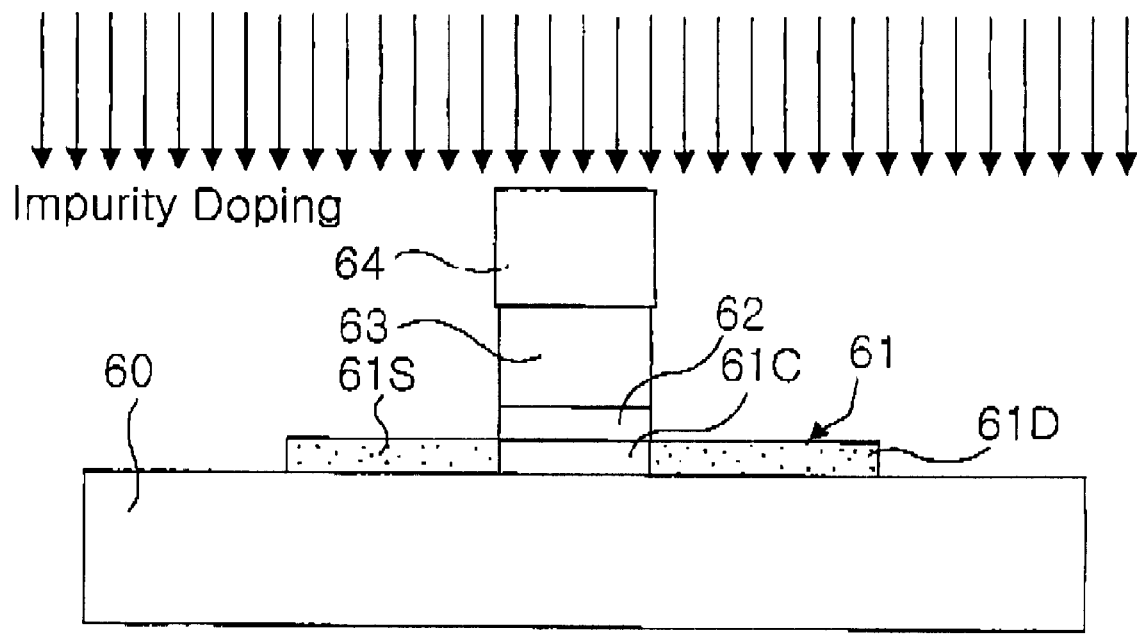
FIG. 6A to FIG. 6D are cross-sectional views illustrating the method for fabricating a crystalline silicon TFT according to still another preferred embodiment of the present invention.
Figure 6B:
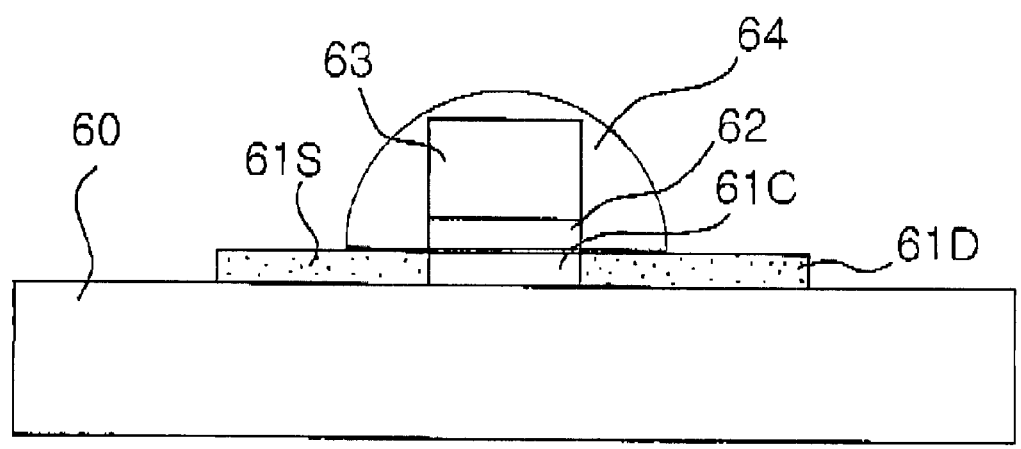

FIG. 6A to FIG. 6E are cross-sectional views illustrating the method for fabricating a crystalline silicon. TFT according to another preferred embodiment of the present invention. Referring to FIG. 6A, an amorphous silicon layer 61 providing the active layer of TFT is formed and patterned on an insulation substrate 60. A gate insulation layer 62 and the gate electrode 63 are formed on the amorphous silicon layer 61. Referring to FIG. 6A, the photoresist 64 used to pattern the gate electrode 63 remains on the gate electrode. In this state, impurity doping is conducted using the photoresist 64 as a mask thereby a source region 61S, a drain region 61D and a channel region 61C are formed in the active layer. The photoresist 64 is reflowed at a temperature higher than the hard baking temperature of the photoresist. As a result, referring to FIG. 6B, the re-flowed photoresist becomes to have a shape of a hemisphere covering the gate insulation layer 62, the gate electrode 63 and a part of the amorphous silicon layer.

Figure 6C:
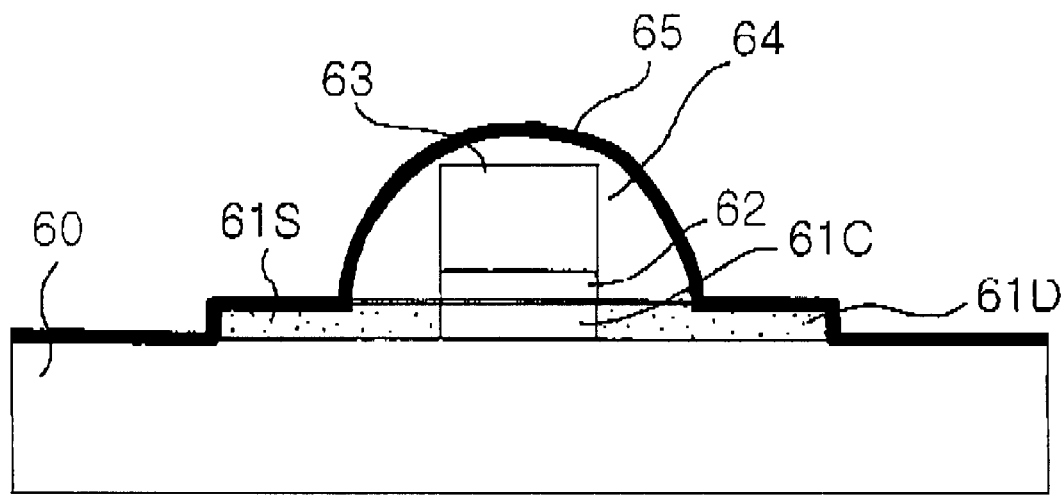
Figure 6D:
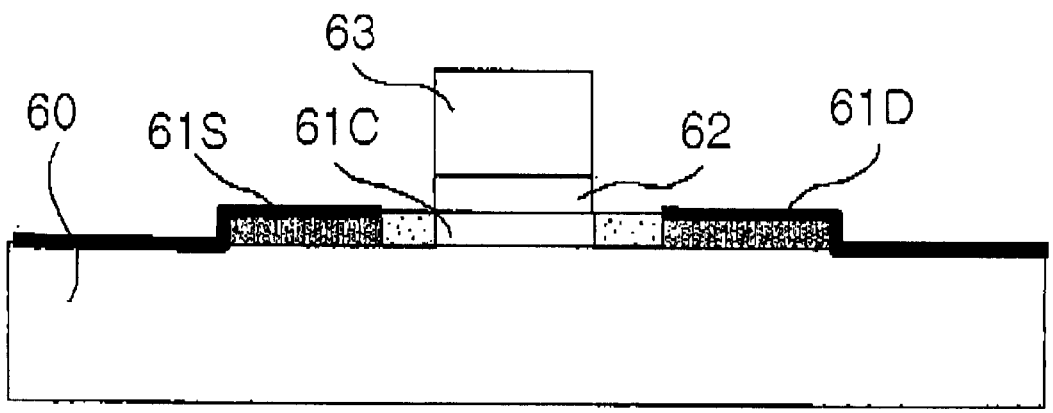

Then, as shown in FIG. 6C, a crystallization inducing metal layer 65 is formed on the entire area of the substrate using the re-flowed photoresist 64 as a mask. Then, as shown in FIG. 6D, the re-flowed photoresist 64 is removed. Since the metal layer 65 was not deposited on the portions of the active layer had been covered with the re-flowed photoresist, a metal offset region can be formed around the gate electrode 63. As mentioned above, the order of the doping process and the metal forming process may be reversed within the scope of the present invention. Thereafter, thermal treatment is performed to crystallize the active layer, and a TFT is completed using conventional methods.

Figure 7A:
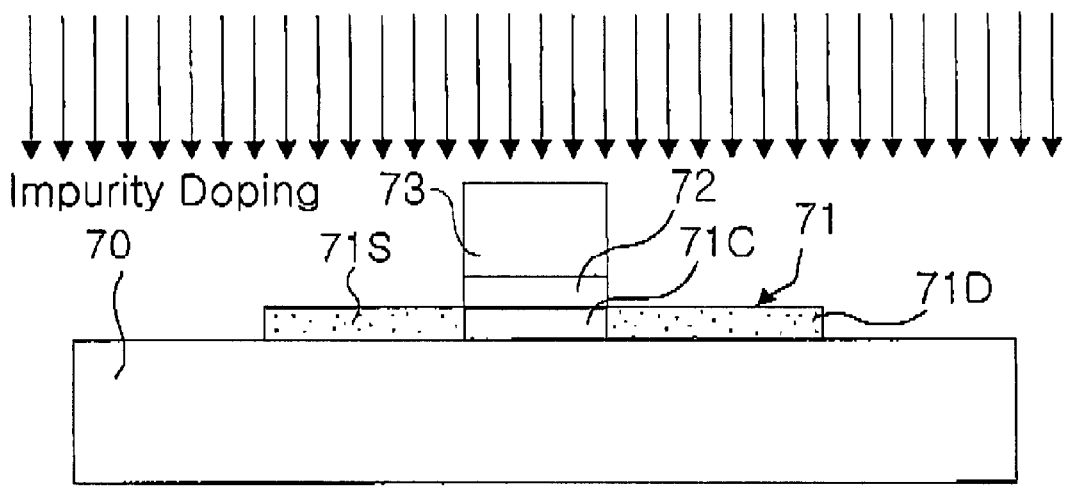
FIG. 7A to FIG. 7E are cross-sectional views illustrating the method for fabricating a crystalline silicon TFT according to still another preferred embodiment of the present invention.
Figure 7B:
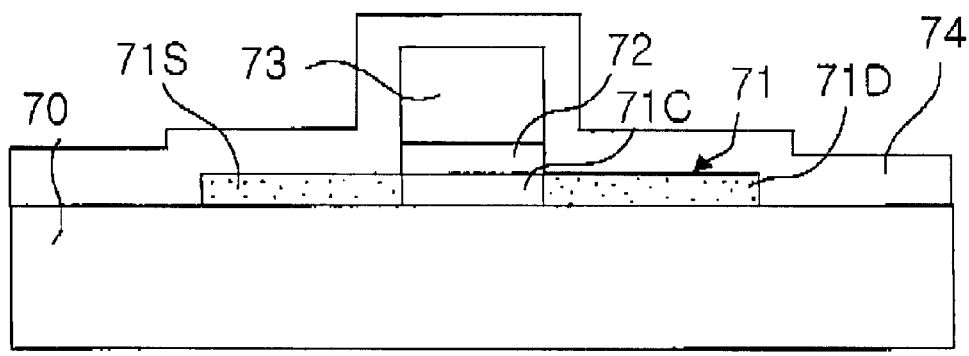

FIG. 7A to FIG. 7G are cross-sectional views illustrating the method for fabricating a crystalline silicon TFT according to another preferred embodiment of the present invention. As shown in FIG. 7A, an amorphous silicon layer 71 providing the active layer of a TFT is formed and patterned on an insulation substrate 70. A gate insulation layer 72 and a gate electrode 73 are formed on the amorphous silicon layer 71. In this state, impurity doping is conducted using the gate electrode 64 as a mask thereby a source region 61S, a drain region 61D and a channel region 61C are formed in the active layer. Then, as shown in FIG. 7B, an insulation layer 74 is formed to cover the entire surface of the substrate.

Figure 7C:
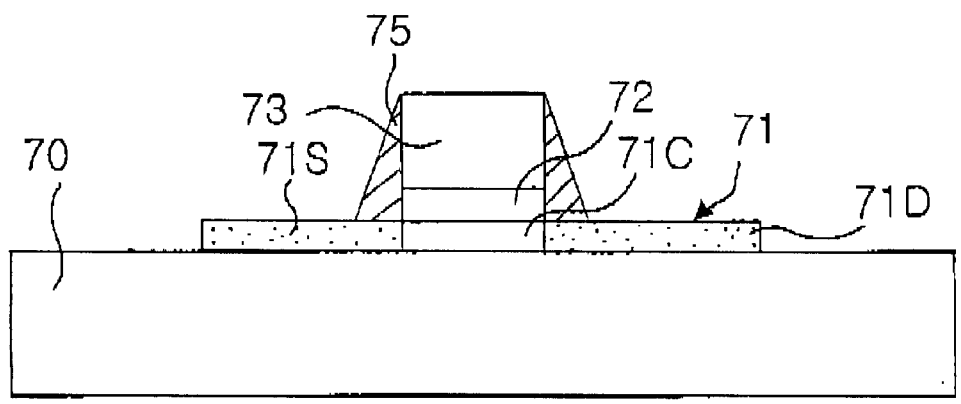
Figure 7D:
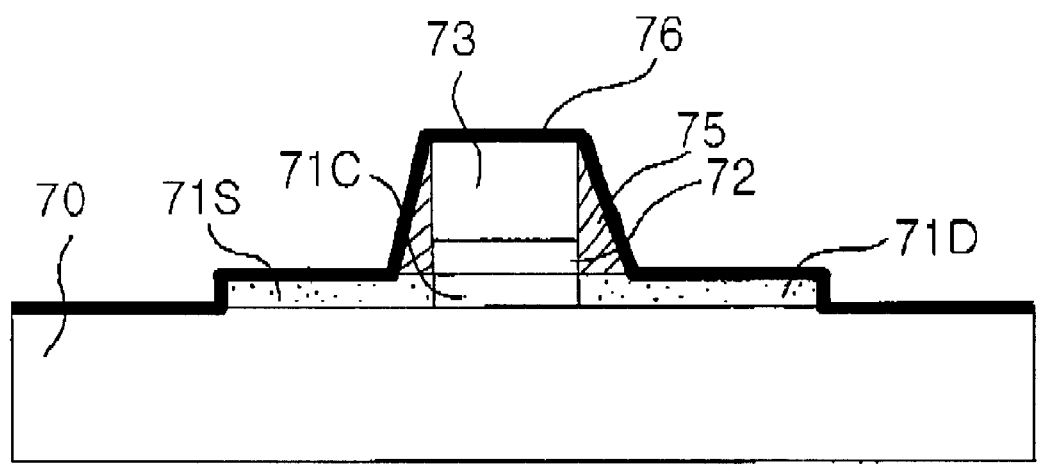
Figure 7E:
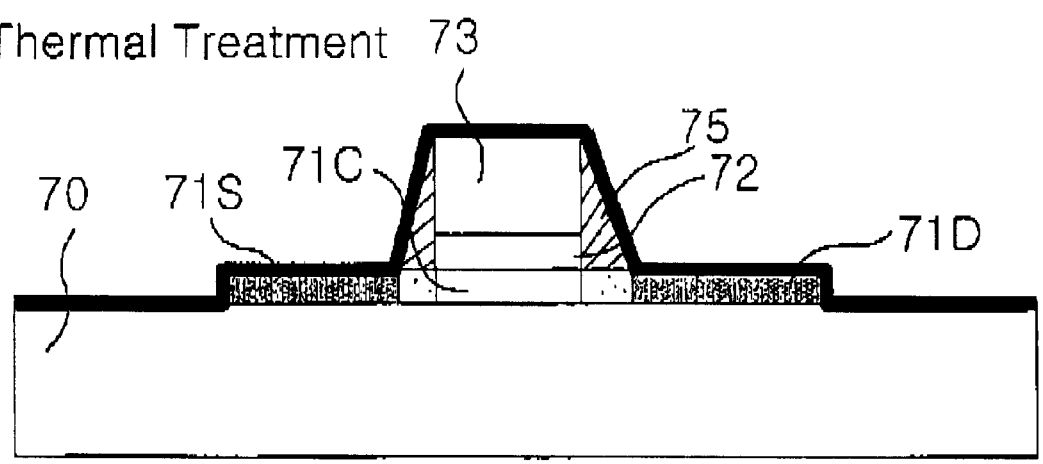

When an anisotropic etching is conducted on the structure of FIG. 7B, the residual portions of the insulation layer 74 remains as a "sidewall" 75 on lateral surfaces of the gate insulation layer 72 and the gate electrode 73 as shown in FIG. 7C. Generally the width of the sidewall tends to increase toward the downward direction. Using this sidewall 75 as a mask, a crystallization metal layer 76 is formed over the substrate to create a metal offset region around the channel region 71C (FIG. 7D), and a thermal treatment for crystallizing the active layer is conducted using a method as mentioned above (FIG. 7E). Thereafter, a TFT is completed according to conventional methods.

The present invention provides a method for crystallizing the active layer of TFT in a large quantity using a furnace at a relatively low temperature than RTA and ELC. Particularly, the method prevents deformation or damages to the TFT substrate because the active layer of TFT is annealed in the temperature range of 300~700° C. lower than the deformation temperature of glass. According to the method, the annealing process for activating the dopant and the crystallizing of the active layer is conducted in a single process to simplify and expedite the TFT fabrication process.

The method of the present invention forms a metal offset region without using a process of forming and removing photoresist. Thus, compared to the conventional method, the present invention may efficiently offset the MILC source metal from the channel region without using additional photoresist process.

Although representative embodiments of the present invention have been disclosed for illustrative purposes, those who are skilled in the art will appreciate that various modifications, additions and substitutions are possible without departing from the scope and spirit of the present invention as defined in the accompanying claims and the equivalents thereof.

What we claim:

1. A method for fabricating a thin film transistor (TFT) including a silicon active layer, the method comprising the steps of:

providing a substrate;

depositing an amorphous silicon layer on the substrate to provide an active layer of the TFT;

forming a gate insulation layer and a gate electrode on the amorphous silicon layer;

doping the amorphous silicon layer with impurity to form a source region, a drain region and a channel region of the active layer and depositing a crystallization inducing metal on at least a portion of the amorphous silicon layer;

crystallizing the amorphous silicon layer crystallization by conducting thermal treatment thereof, wherein the crystallization inducing metal is offset from the channel region of the active layer using a mask which does not include a photoresist layer.

2. The method for fabricating a TFT according to claim 1, wherein said crystallization inducing metal is offset from the channel region by over-etching the gate electrode to expose side edges of the gate insulation layer and depositing the crystallization inducing metal on the amorphous silicon layer using the gate insulation layer as a mask.

3. The method for fabricating a TFT according to claim 1, wherein said crystallization inducing metal is offset from the channel region by forming the gate electrode into multiple layers respectively having different widths and depositing the crystallization inducing metal using the gate electrode layer having the greatest width as a mask.

4. The method for fabricating a TFT according to claim 3, further including a step of doping impurity into the active layer after removing the gate electrode layer used as a mask by etching.

5. The method for fabricating a TFT according to claim 1, wherein said crystallization inducing metal is offset from the channel region by forming an oxide layer on the gate electrode and depositing the crystallization inducing metal using the oxide layer as a mask.

6. The method for fabricating a TFT according to claim 1, wherein a the oxide layer formed on the gate electrode is an anodizing oxide layer obtained by anodizing the gate electrode.

7. The method for fabricating a TFT according to claim 1, wherein said crystallization inducing metal is offset from the channel region by forming an insulation layer over the gate electrode and the active layer and performing anisotropic etching of the insulation layer to form a side wall surrounding the gate electrode and depositing the crystallization inducing metal using the side wall as a mask.

8. The method for fabricating a TFT according to claim 7, wherein the width of the side wall becomes wider in the direction toward the substrate.

9. The method for fabricating a TFT according to claim 1, wherein the crystallization inducing metal comprises at least one metal component selected from the group consisting of Ni, Pd, Ti, Ag, Au, Al, Sn, Sb, Cu, Co, Cr, Mo, Tr, Ru, Rh, Cd and Pt.

10. The method for fabricating a TFT according to claim 1, wherein the crystallization inducing metal is deposited with a thickness in the range of 10~200 Å using sputtering, evaporation, CVD or ion injection method.

11. The method for fabricating a TFT according to claim 1, wherein the active layer is crystallized by furnace annealing, RTA or ELC method.

12. A method for fabricating a thin film transistor (TFT) including a silicon active layer, the method comprising the steps of:

providing a substrate;

depositing an amorphous silicon layer on the substrate to provide an active layer of the TFT;

forming a gate insulation layer and a gate electrode on the amorphous silicon layer;

doping the amorphous silicon layer with impurity to form a source region, a drain region and a channel region of the active layer and depositing a crystallization inducing metal on at least a portion of the amorphous silicon layer;

crystallizing the amorphous silicon layer crystallization by conducting thermal treatment thereof;

wherein the crystallization inducing metal is offset from the channel region of the active layer using a photoresist mask which is formed by processing a photoresist layer used to pattern the gate electrode and remaining on the top of the patterned gate electrode.

13. The method for fabricating a TFT according to claim 12, wherein said crystallization inducing metal is offset from the channel region by forming the gate insulation layer and the gate electrode to have a undercut structure with respect to the photoresist layer and depositing the crystallization inducing metal using the photoresist layer as a mask.

14. The method for fabricating a TFT according to claim 12, wherein said crystallization inducing metal is offset from the channel region by re-flowing the photoresist layer by heating and depositing the crystallization inducing metal using the re-flown photoresist as a mask.

15. The method for fabricating a TFT according to claims 14, wherein during the re-flow process the photoresist is heated to a temperature higher than the hard baking temperature of the photoresist.

16. The method for fabricating a TFT according to claim 12, wherein the crystallization inducing metal comprises at least one metal component selected from the group consisting of Ni, Pd, Ti, Ag, Au, Al, Sn, Sb, Cu, Co, Cr, Mo, AT, Ru, Rh, Cd and Pt.

17. The method for fabricating a TFT according to claim 12, wherein the crystallization inducing metal is deposited with a thickness in the range of 10~200 Å using sputtering, evaporation, CVD or ion injection method.

18. The method for fabricating a TFT according to claim 12, wherein the active layer is crystallized by furnace annealing, RTA or ELC method.

* * * * *